United States Patent
Yamaoka et al.

(10) Patent No.: US 9,626,160 B2
(45) Date of Patent: Apr. 18, 2017

(54) SEQUENCE-PROGRAM-COMPONENT CREATION PROGRAM AND SEQUENCE-PROGRAM-COMPONENT CREATION DEVICE

(71) Applicants: Takayuki Yamaoka, Tokyo (JP); Kenichi Sakamoto, Tokyo (JP)

(72) Inventors: Takayuki Yamaoka, Tokyo (JP); Kenichi Sakamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/772,232

(22) PCT Filed: Mar. 29, 2013

(86) PCT No.: PCT/JP2013/059685
§ 371 (c)(1),
(2) Date: Sep. 2, 2015

(87) PCT Pub. No.: WO2014/155717
PCT Pub. Date: Oct. 2, 2014

(65) Prior Publication Data
US 2016/0034259 A1 Feb. 4, 2016

(51) Int. Cl.
*G06F 9/44* (2006.01)
*G05B 19/05* (2006.01)

(52) U.S. Cl.
CPC ............. *G06F 8/30* (2013.01); *G05B 19/056* (2013.01); *G06F 8/36* (2013.01); *G06F 9/44* (2013.01); *G05B 2219/13099* (2013.01)

(58) Field of Classification Search
None
See application file for complete search history.

(56) References Cited

U.S. PATENT DOCUMENTS 4,449,180 A    5/1984 Ohshima et al.
5,148,363 A *  9/1992 Sakamoto ............ G05B 19/058
                                                         700/108

(Continued)

FOREIGN PATENT DOCUMENTS

JP    62-202202 A    9/1987
JP    02-005102 A    1/1990

(Continued)

OTHER PUBLICATIONS

Communication dated Jan. 23, 2015 from the Taiwan Intellectual Property Office in counterpart application No. 102136719.

(Continued)

*Primary Examiner* — Daxin Wu
(74) *Attorney, Agent, or Firm* — Sughrue Mion, PLLC; Richard C. Turner

(57) ABSTRACT

To provide a sequence-program-component creation program that causes a computer to perform a searching step of searching an overall circuit of a sequence program for a common logic part and extracting a logic pattern that appears in common in a circuit pattern arranged in the common logic part as a common circuit pattern, a component-candidate displaying step of displaying an extracted common circuit pattern as a candidate for a program component, a component registration setting step of registering a common circuit pattern selected by a user from candidates for the program component, and a replacing step of replacing the common logic part of the sequence program with the program component.

7 Claims, 11 Drawing Sheets

(56) References Cited

U.S. PATENT DOCUMENTS

| | | | |
|---|---|---|---|
| 5,225,975 A | | 7/1993 | Gates et al. |
| 5,251,122 A | * | 10/1993 | Sakamoto ............ G05B 19/056 700/110 |
| 5,267,145 A | | 11/1993 | Zifferer et al. |
| 5,410,469 A | * | 4/1995 | Sakamoto ............ G05B 19/058 700/9 |
| 5,586,335 A | * | 12/1996 | Utan .................... G05B 19/056 700/18 |
| 5,841,657 A | * | 11/1998 | Hoshino .......... G05B 19/41845 700/104 |
| 8,356,000 B1 | * | 1/2013 | Koza ...................... G06N 3/126 706/13 |
| 2009/0007000 A1 | | 1/2009 | Hasegawa et al. |
| 2016/0179904 A1 | * | 6/2016 | Mochizuki ....... H03K 19/17764 707/722 |

FOREIGN PATENT DOCUMENTS

| | | |
|---|---|---|
| JP | 04-286002 A | 10/1992 |
| JP | 05-061509 A | 3/1993 |
| JP | 2526692 B2 | 8/1996 |
| JP | 09-212212 A | 8/1997 |
| JP | 2000-163109 A | 6/2000 |
| JP | 2000-357005 A | 12/2000 |
| JP | 2003-303003 A | 10/2003 |
| JP | 3829905 B2 | 10/2006 |
| JP | 2007-206798 A | 8/2007 |
| JP | 2008-204237 A | 9/2008 |
| JP | 2009-009462 A | 1/2009 |
| JP | 2009-116429 A | 5/2009 |
| JP | 2009116429 A * | 5/2009 |
| WO | 00/07081 A1 | 2/2000 |

OTHER PUBLICATIONS

JPO Office Action for Application No. 2015-507901 dated May 22, 2015.
Communication dated May 24, 2016 from the German Patent and Trademark Office issued in corresponding Application No. 112013006769.2.
Communication dated Apr. 12, 2016 from the State Intellectual Property Office of the P.R.C. issued in corresponding Application No. 201380075177.1.
Written Opinion for PCT/JP2013/059685 dated May 28, 2013 [PCT/ISA/237].
International Search Report for PCT/JP2013/059685 dated May 28, 2013.
Communication dated Nov. 9, 2016 from the State Intellectual Property Office of the P.R.C. in counterpart Application No. 201380075177.1.
Communication dated Dec. 21, 2016, mailed by the Korean Intellectual Property Office in corresponding Korean Application No. 10-2015-7030843.

* cited by examiner

FIG.11
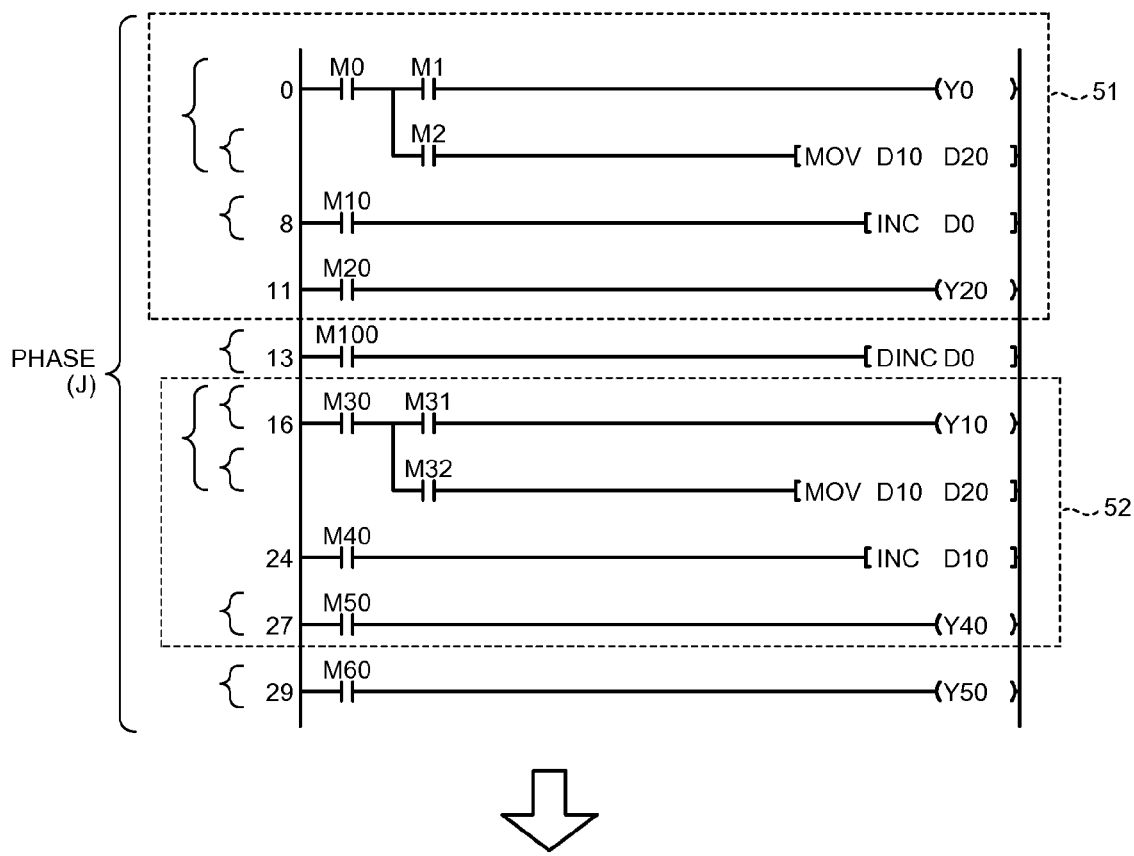
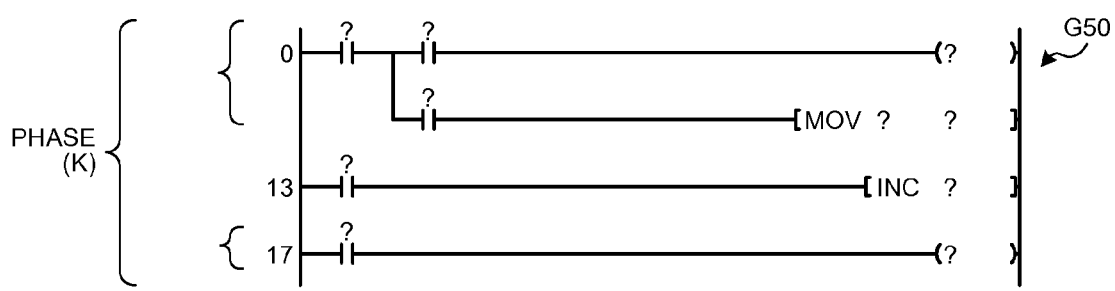

SEQUENCE-PROGRAM-COMPONENT CREATION PROGRAM AND SEQUENCE-PROGRAM-COMPONENT CREATION DEVICE

CROSS REFERENCE TO RELATED APPLICATIONS

This application is a National Stage of International Application No. PCT/JP2013/059685, filed on Mar. 29, 2013, the contents of all of which are incorporated herein by reference in their entirety.

FIELD

The present invention relates to a sequence-program-component creation program and a sequence-program-component creation device that creates a program component from a sequence program.

BACKGROUND

It is desirable to efficiently create a sequence program. Therefore, a common logic part of a sequence program is taken out and registered as a program component (componentization) and the program part is reused in a plurality of sequence programs (see Patent Literatures 1 and 2, for example). As an example of the program component of a sequence program, a function block (FB) is given.

CITATION LIST

Patent Literatures

Patent Literature 1: Japanese Patent Application Laid-open No. 2000-357005
Patent Literature 2: Japanese Patent Application Laid-open No. 2009-116429

SUMMARY

Technical Problem

However, in the conventional technique described above, before a sequence program as an edit target is edited, it is necessary to find a common logic part (a program part) from the existing sequence program and componentize the program part. Accordingly, there is a problem in that a componentization operation takes a long time.

The present invention has been achieved in view of the above problem, and an object of the invention is to easily componentize a sequence program in a short time.

Solution to Problem

In order to solve the aforementioned problems, a sequence-program-component creation program that causes a computer to perform according to one aspect of the present invention is constructed to include: a searching step of searching an overall circuit of a sequence program for a common logic part and extracting a logic pattern that appears in common in a circuit pattern arranged in the common logic part as a common circuit pattern; a component-candidate displaying step of displaying an extracted common circuit pattern as a candidate for a program component; a component registration setting step of registering a common circuit pattern selected by a user from candidates for the program component; and a replacing step of replacing the common logic part of the sequence program with the program component.

Advantageous Effects of Invention

According to the present invention, a sequence program can be easily componentized in a short time.

BRIEF DESCRIPTION OF DRAWINGS

FIG. 11 is a diagram illustrating an example of a common circuit pattern to be extracted.

DESCRIPTION OF EMBODIMENTS

Exemplary embodiments of a sequence-program-component creation program and a sequence-program-component creation device according to the present invention will be described below in detail with reference to the accompanying drawings. The present invention is not limited to the embodiments.

First Embodiment

A concept of a program componentization process according to the embodiments of the present invention is described first. In the embodiments, "common circuit pattern G" and "common logic part H" are distinguished from each other as follows:

Common circuit pattern G: a logic pattern that appears in common in a sequence program.
Common logic part H: a part (an area) of a sequence program where a common circuit pattern G appears.

Figure 1:
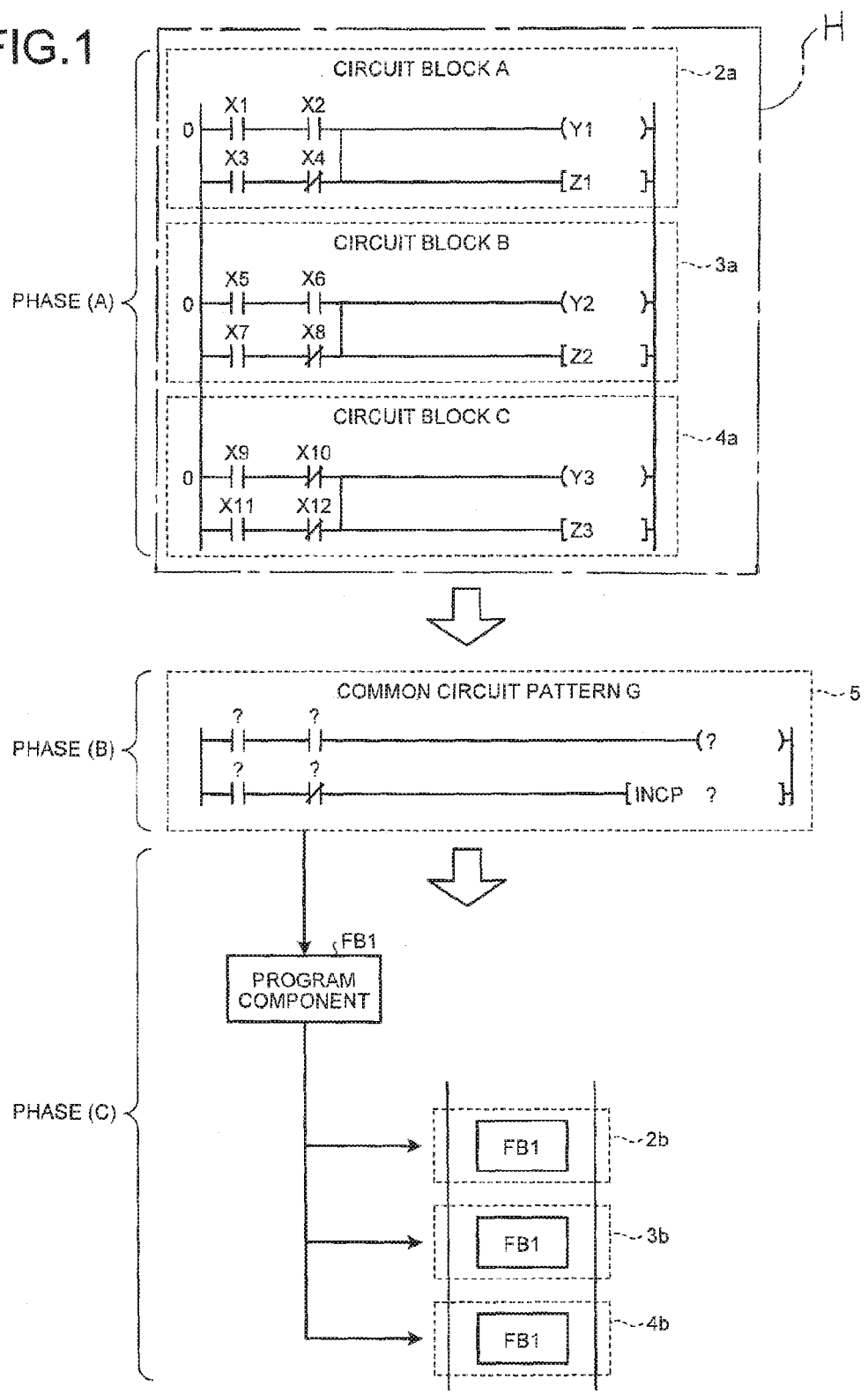
FIG. 1 is an explanatory diagram of a concept of a program componentization process according to a first embodiment of the present invention.

FIG. 1 is an explanatory diagram of a concept of a program componentization process according to a first embodiment of the present invention. A program-component creation device (a program-component creation device 1A or 1B to be described later) is a device, such as a computer, that creates a program component from a sequence program (a ladder program).

The program-component creation devices 1A and 1B automatically determine a common logic part (a program part) H that can be componentized and extracts the common logic part H from a sequence program. The program-component creation devices 1A and 1B have at least two functions to be described below.

A first function is a function of searching the overall circuit of a sequence program for a common logic part H that can be componentized and displaying the common logic part H. A ladder program that is a sequence program is constituted by contact/coil-corresponding commands. The program-component creation devices 1A and 1B thus search for a common circuit pattern G that is common only in the logic of the contact-corresponding command or the coil-corresponding command and a program part (a common logic part H), and displays the common circuit pattern G and the common logic part H. The searched common circuit pattern G is a candidate for a program component (a macro, a subroutine, and the like).

A second function is a function by which when any of the common circuit patterns G searched by the first function is selected by a user, the selected common circuit pattern G is converted into a program component (subjected to componentization) and the program component is registered. With the second function, the common logic part H searched by the first function is replaced with an instance of the registered program component, so that a sequence program is automatically componentized.

Figure 5:
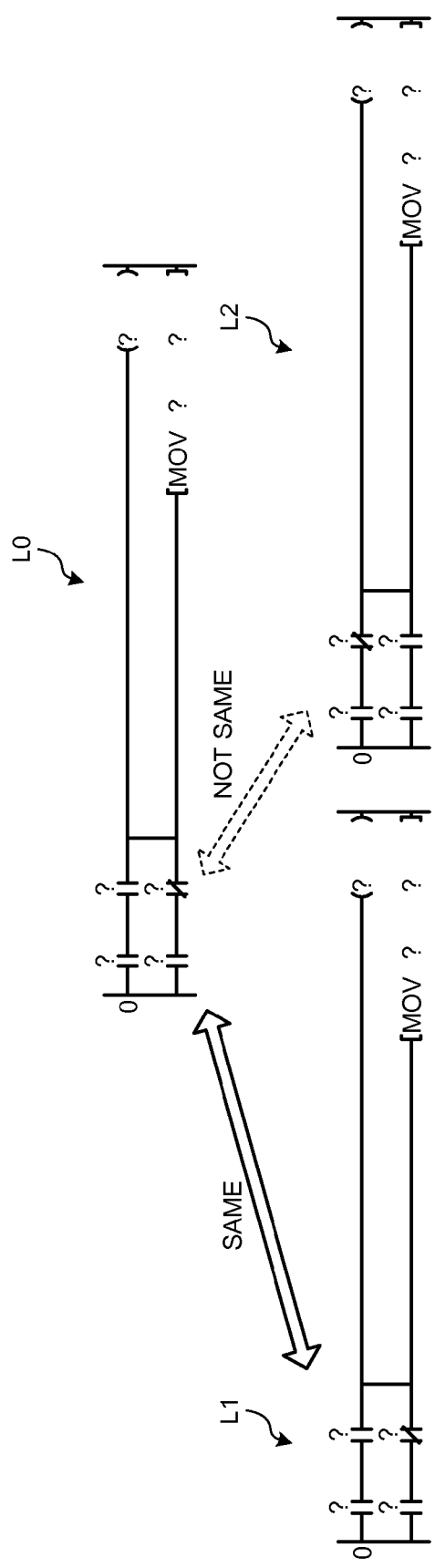
FIG. 5 is an explanatory diagram of a graphically-common logic part.
Figure 6:
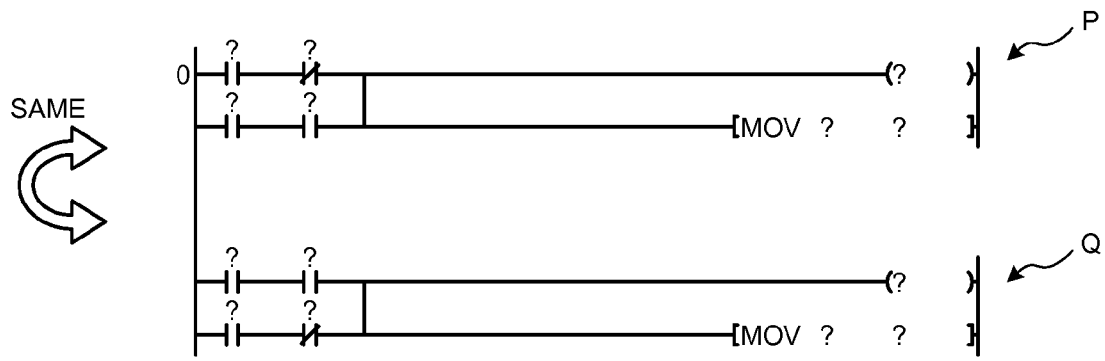
FIG. 6 is an explanatory diagram of a logically-common logic part.

As illustrated in a phase (A) of FIG. 1, the program-component creation devices 1A and 1B extract a common logic part H from a sequence program. As an example of a common logic part, FIG. 5 illustrates a graphically-common logic part and FIG. 6 illustrates a logically common part. The program-component creation devices 1A and 1B extract a block in which circuit blocks 2a to 4a are arranged as the common logic part H.

Furthermore, as illustrated in a phase (B) of FIG. 1, the program-component creation devices 1A and 1B set a common circuit pattern G that can be componentized on the basis of the logic of the circuit blocks 2a to 4a. In other words, the program-component creation devices 1A and 1B set a logic that is common to the circuit blocks 2a to 4a as the common circuit pattern G. The program-component creation devices 1A and 1B thus handle the circuit blocks 2a to 4a as the common circuit pattern G.

As illustrated in a phase (C) of FIG. 1, the program-component creation devices 1A and 1B register the common circuit pattern G as a program component FB1. The program-component creation devices 1A and 1B then replace the circuit blocks 2a to 4a with the program component FB1.

As a result, the circuit block 2a is replaced with the program component FB1 (an instance 1) and becomes a circuit block 2b. Similarly, the circuit block 3a is replaced with the program component FB1 (an instance 2) and becomes a circuit block 3b, and the circuit block 4a is replaced with the program component FB1 (an instance 3) and becomes a circuit block 4b.

The program-component creation devices 1A and 1B store therein the sequence program that has been replaced with the program component FB1 and a circuit pattern of the program component FB1. Program editing is then performed according to an instruction of a user by using the sequence program replaced with the program component FB1 and the circuit pattern of the program component FB1.

Figure 2:
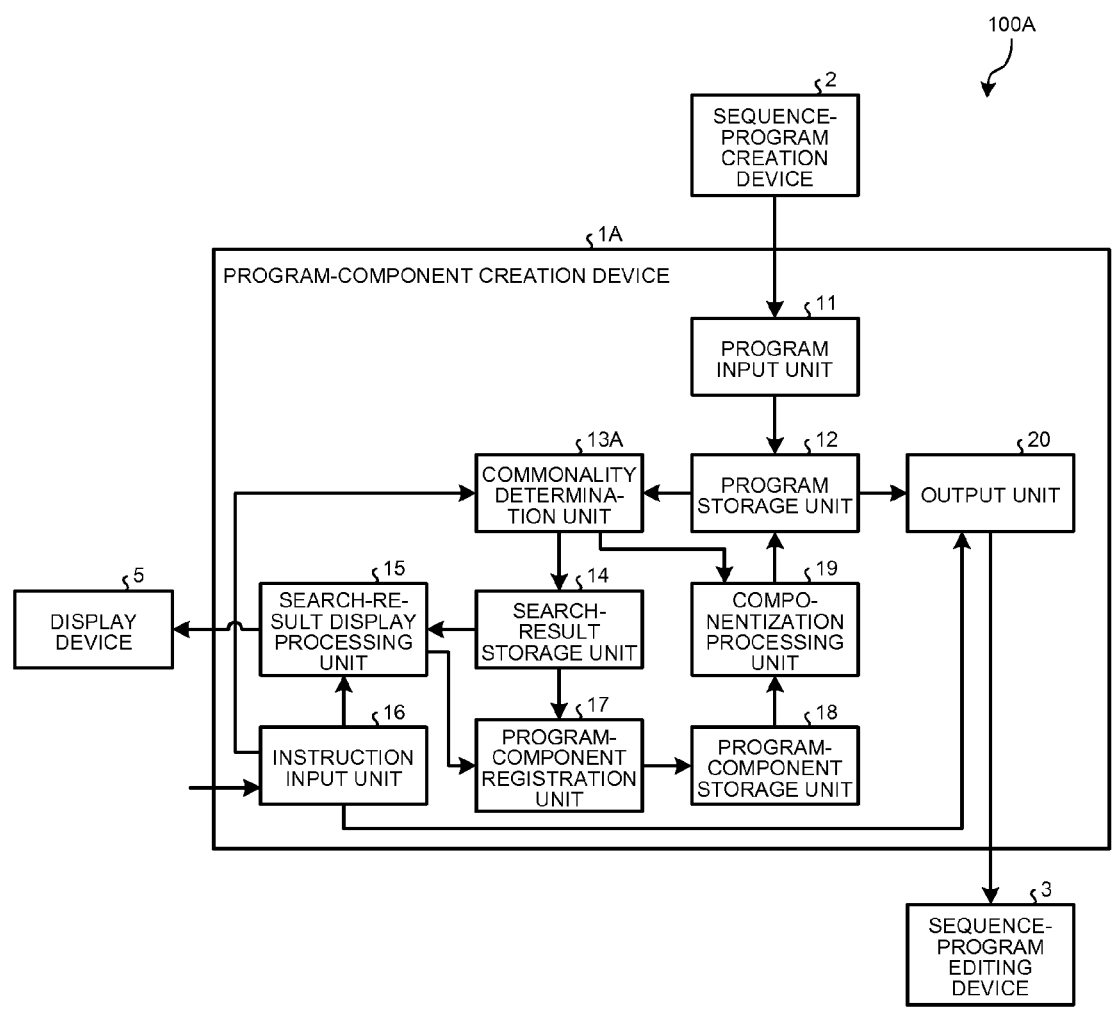
FIG. 2 is a diagram illustrating a configuration of a program-component creation device according to the first embodiment.

FIG. 2 is a diagram illustrating a configuration of a program-component creation device according to the first embodiment. A program editing system 100A includes a sequence-program creation device 2, the program-component creation device 1A, a display device 5, and a sequence-program editing device 3.

The sequence-program creation device 2 is a device that creates a sequence program, which is operated by a PLC (Programmable Logic Controller) (sequencer) system and the like. The sequence-program creation device 2 inputs the created sequence program to the program-component creation device 1A.

The sequence-program editing device 3 is a device that performs sequence program editing by using a sequence program that has been replaced with a program component in the program-component creation device 1A. The display device 5 is a liquid crystal monitor and the like, and displays a sequence program, a common circuit pattern G, a program component, and the like according to an instruction of the program-component creation device 1A.

The program-component creation device 1A includes, as engineering tools, a program storage unit 12, a commonality determination unit (searching section) 13A, a search-result storage unit 14, a search-result display processing unit (component-candidate display unit) 15, a program-component registration unit (component setting unit) 17, a program-component storage unit 18, and a componentization processing unit (replacement unit) 19. The program-component creation device 1A also includes a program input unit 11, an instruction input unit 16, and an output unit 20.

The engineering tool is a tool that creates a program component from a sequence program. For example, the engineering tool can be realized as S/W (software) on a PC (Personal Computer).

A sequence program is input to the program input unit 11 and the program input unit 11 then transmits the sequence program to the program storage unit 12. The program storage unit 12 is a memory or the like that stores therein a sequence program (a componentization target program) in which a common logic part H is searched. After the sequence program is componentized, the program storage unit 12 stores therein the componentized sequence program. For example, the program storage unit 12 corresponds to a program file in a project created by an engineering tool and the like.

The commonality determination unit 13A reads a sequence program stored in the program storage unit 12 and determines whether a common logic part H is included in the sequence program. When the common logic part H is included in the sequence program, the commonality determination unit 13A extracts a common logic of the common logic part H as a common circuit pattern G. In other words, the commonality determination unit 13A extracts a logic pattern that appears in common in a circuit pattern arranged in the common logic part H as the common circuit pattern G. As specific means for determining the common logic part H, the program-component creation device 1A can employ a code clone detection method and the like. The search-result storage unit 14 is a memory or the like that stores therein the common circuit pattern G extracted by the commonality determination unit 13A as a search result.

The search-result display processing unit 15 displays a list of search results in the search-result storage unit 14 on the display device 5. When a common circuit pattern G to be componentized is selected by a user from the displayed search results, the search-result display processing unit 15 transmits the selected common circuit pattern G to the program-component registration unit 17.

As described above, in the present embodiment, the search-result display processing unit 15 displays a list of common circuit patterns G (a list of search results) extracted by the commonality determination unit 13A on the display device 5 and enables a user to select a common circuit pattern G to be componentized. Due to this configuration, the program-component creation device 1A supports creation of a sequence program component.

An instruction of a user is input to the instruction input unit 16 and the instruction input unit 16 transmits the instruction to the search-result display processing unit 15 and the like. The instruction of a user includes an instruction relating to a search (a search instruction), an instruction relating to componentization (a component specifying instruction), an instruction relating to output (an output instruction), and the like.

The search instruction is an instruction to search a sequence program for a common circuit pattern G, and is transmitted from the instruction input unit 16 to the commonality determination unit 13A. The component specifying instruction is an instruction to specify a common circuit pattern G to be componentized from a search result, and is transmitted from the instruction input unit 16 to the search-result display processing unit 15. The output instruction is an instruction to output a sequence program to an external device and the like, and is transmitted from the instruction input unit 16 to the output unit 20.

When a selected common circuit pattern G is transmitted from the search-result display processing unit 15 to the program-component registration unit 17, the program-component registration unit 17 converts the selected common circuit pattern G into a program component and registers the program component in the program-component storage unit 18.

The program-component storage unit 18 is a memory or the like that stores therein a program component according to an instruction from the program-component registration unit 17. The componentization processing unit 19 replaces a common logic part H of a sequence program stored in the program storage unit 12 with the program component stored in the program-component storage unit 18. The componentization processing unit 19 then stores the sequence program after the replacement has been performed in the program storage unit 12.

When an output instruction is transmitted from the instruction input unit 16 to the output unit 20, the output unit 20 extracts a sequence program specified by the output instruction from the program storage unit 12 and outputs the sequence program to an external device and the like.

Figure 3:
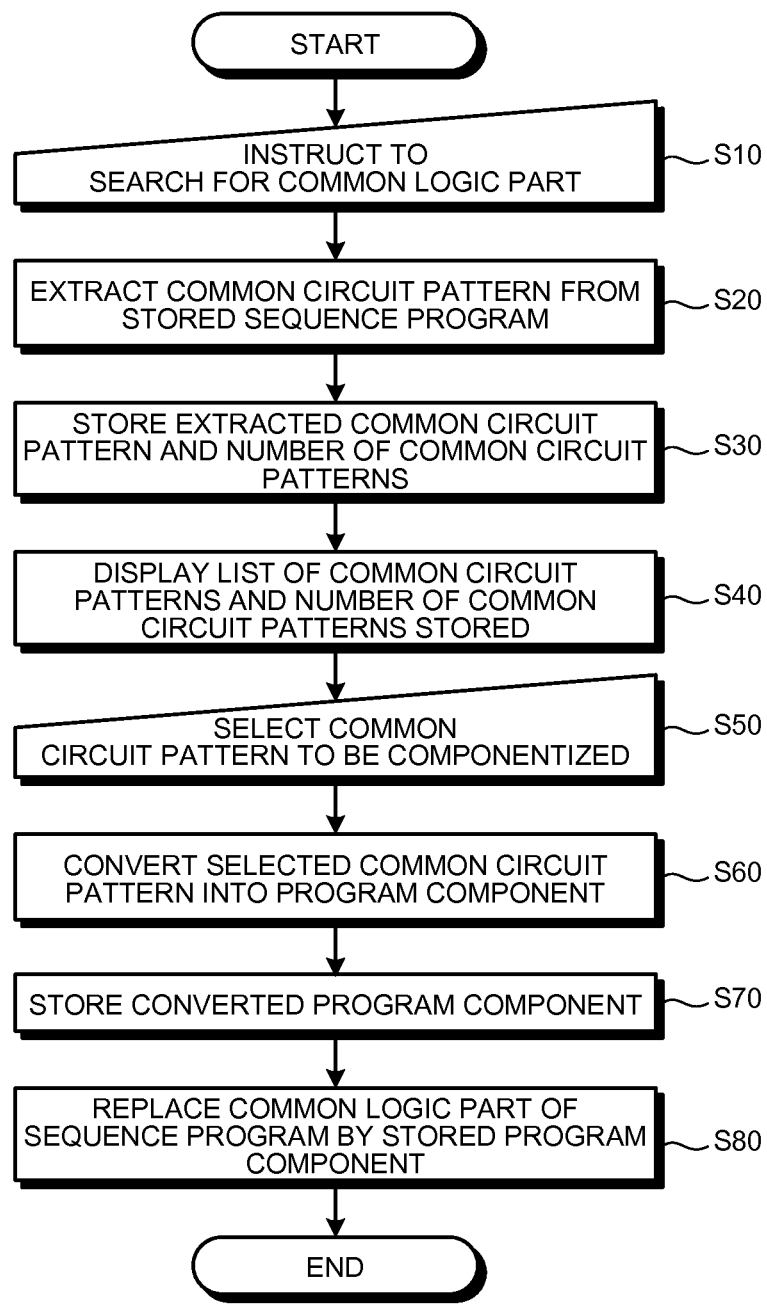
FIG. 3 is a flowchart illustrating a process procedure of the program componentization process according to the first embodiment.

FIG. 3 is a flowchart illustrating a process procedure of the program componentization process according to the first embodiment. A sequence program is created in advance by the sequence-program creation device 2 and transmitted to the program input unit 11 of the program-component creation device 1A. The program input unit 11 stores the sequence program transmitted from the sequence-program creation device 2 in the program storage unit 12.

(User Operation 1)

When an instruction to search for a common circuit pattern G (a common logic part) is input through the instruction input unit 16 by a user, the search instruction is transmitted from the instruction input unit 16 to the commonality determination unit 13A. With this operation, program componentization process is started (Step S10).

(Process 1)

The commonality determination unit 13A extracts a common circuit pattern G from a sequence program stored (accumulated) in the program storage unit 12. For example, the commonality determination unit 13A extracts a common logic part H from the sequence program, and then extracts the common circuit pattern G from circuit blocks (the circuit blocks 2a to 4a and the like) arranged in the common logic part H (Step S20).

(Process 2)

The commonality determination unit 13A associates the common circuit pattern G extracted from the common logic part H with the number of the common circuit patterns G and stores the extracted common circuit pattern G and the number of the common circuit patterns G in the search-result storage unit 14 (Step S30).

The commonality determination unit 13A also associates the location of the common logic part H (for example, a column number of a ladder program) with information (program identification information) for identifying the sequence program from which the common logic part H has been extracted, and transmits the location and the information to the componentization processing unit 19.

(Process 3)

The search-result display processing unit 15 displays a list of the common circuit patterns G and the number of the common circuit patterns G stored in the search-result storage unit 14 on the display device 5. For example, the display device 5 displays the common circuit pattern G illustrated in FIG. 1 and the number (three in FIG. 3) of the common circuit patterns G (Step S40).

(User Operation 2)

The user then selects a common circuit pattern G to be componentized. When a component specifying instruction to specify any of the common circuit patterns G is input through the instruction input unit 16 by the user, the component specifying instruction is transmitted to the search-result display processing unit 15 (Step S50). The search-result display processing unit 15 transmits the common circuit pattern G corresponding to the component specifying instruction to the program-component registration unit 17.

(Processes 4 and 5)

The program-component registration unit 17 converts the logic of the selected common circuit pattern G into a program component (Step S60). The program-component registration unit 17 stores the converted program component in the program-component storage unit 18 (Step S70). In this manner, the common circuit pattern G selected by the user is stored as a program component in the program-component storage unit 18.

(Process 6)

The componentization processing unit 19 replaces the common logic part H of the sequence program stored in the program storage unit 12 with the program component stored in the program-component storage unit 18 (Step S80). When the common logic part H is replaced with the program component, the componentization processing unit 19 performs allocation of input and output variables of the replaced program component.

The componentization processing unit 19 performs replacement of a circuit pattern with the program component on the sequence program from which the common circuit pattern G has been extracted by the commonality determination unit 13A. Specifically, the componentization processing unit 19 extracts the sequence program as a componentization target from the program storage unit 12 on the basis of the program identification information. The componentization processing unit 19 then replaces a circuit pattern of the common logic part H of the extracted sequence program with the program component stored in the program-component storage unit 18.

After at least a part of the sequence program is replaced with the program component, the sequence program where replacement has been performed is stored in the program storage unit 12. When the user then inputs an output instruction to the instruction input unit 16, the output instruction is transmitted from the instruction input unit 16 to the output unit 20. The output unit 20 extracts the sequence program specified by the output instruction from the program storage unit 12 and transmits the sequence program to the sequence-program editing device 3. With this operation, the sequence-program editing device 3 edits the sequence program according to an instruction of the user.

While a common circuit pattern G specified by a user is componentized in the present embodiment, the program-component registration unit 17 may componentize all the extracted common circuit patterns G.

As described above, the program-component creation device 1A automatically searches a sequence program for a common circuit pattern G and displays the common circuit pattern G, and thus the number of steps in an operation of detecting a candidate for a program component can be reduced. Therefore, the number of operations of searching for a candidate for a program component can be reduced.

A program component and an instance can be created only through selection of a candidate for componentization by a user, and thus the number of operations of allocating input and output variables can be reduced. Therefore, the number of operations of replacing a part of a sequence program with a program component can be reduced.

Because a process of displaying a candidate for a program component and creation of a program component and an instance can be performed successively, a ladder program with less overlapped portions can be efficiently created.

As described above, the program-component creation device 1A does not search for a program component registered in advance but componentize a common circuit pattern G extracted from a sequence program. Due to this configuration, the program-component creation device 1A can edit a sequence program by using the common circuit pattern G (replace the common circuit pattern G with a program component) without registering in advance a program component from an existing sequence program.

According to the first embodiment, a common circuit pattern G extracted from a sequence program is replaced with a program component, and thus it is possible to easily componentize the sequence program in a short time.

Second Embodiment

A second embodiment of the present invention is described next with reference to FIGS. 4 to 6. In the second embodiment, at the time of extracting a common circuit pattern G, a graphically-common logic part (a logic part having the same circuit diagram) or a logically (semantically)-common logic part (a logic part having the same logic of a circuit diagram) is determined.

Figure 4:
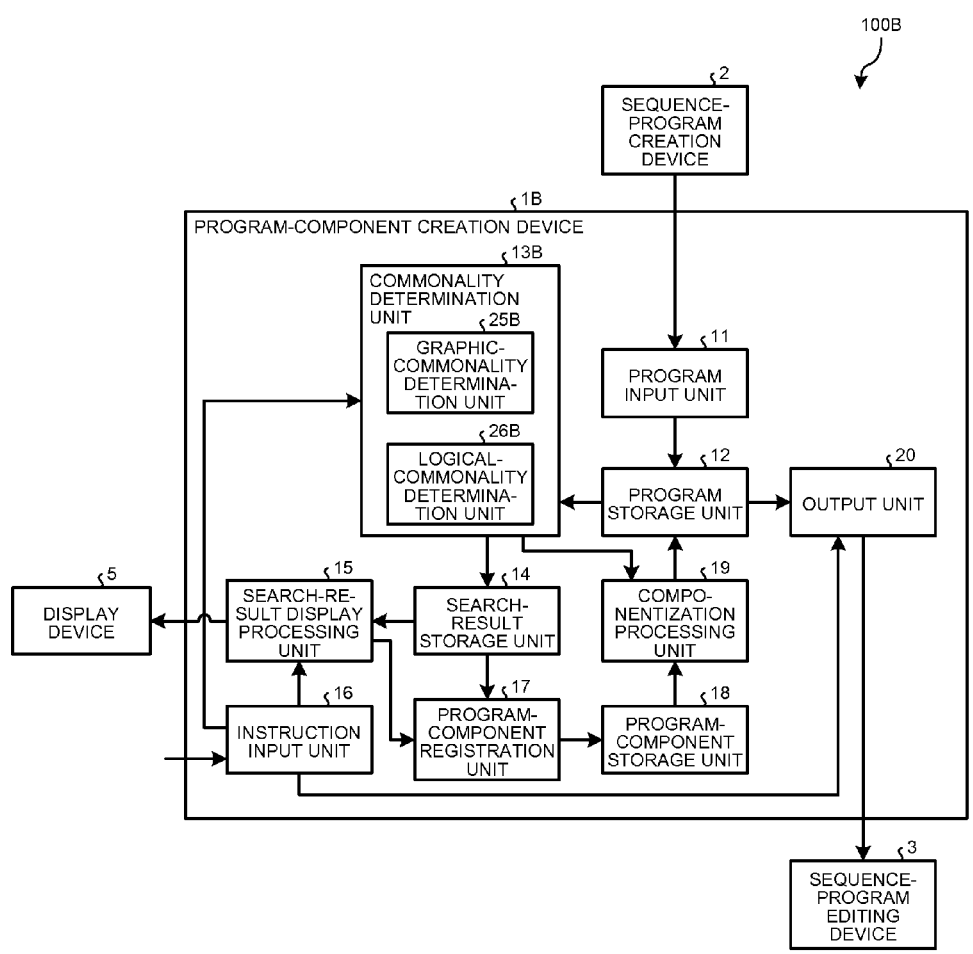
FIG. 4 is a diagram illustrating a configuration of a program-component creation device according to the second embodiment.

FIG. 4 is a diagram illustrating a configuration of a program-component creation device according to the second embodiment. Among the constituent elements illustrated in FIG. 4, constituent elements achieving functions identical to those of the program editing system 100A according to the first embodiment illustrated in FIG. 2 are denoted by the same reference numerals, and redundant descriptions thereof will be omitted.

A program editing system 100B includes the sequence-program creation device 2, the program-component creation device 1B, and the sequence-program editing device 3. Different from the program-component creation device 1A, the program-component creation device 1B includes a commonality determination unit 13B instead of the commonality determination unit 13A.

The commonality-determination unit 13B includes a graphic-commonality determination unit 25B and a logical-commonality determination unit 26B. The graphic-commonality determination unit 25B determines whether a graphically-common logic part is present in the sequence program stored in the program storage unit 12. The graphically-common logic part is a circuit having the same arrangement of circuit symbols in an electronic circuit diagram. When a graphically-common logic part is present, the graphic-commonality determination unit 25B extracts the graphically-common logic part from the sequence program.

The logic-commonality determination unit 26B determines whether a logically-common logic part is present in the sequence program stored in the program storage unit 12. The logically-common logic part is a circuit that performs the logically-same operation while having a graphically-different arrangement of circuit symbols.

FIG. 5 is an explanatory diagram of a graphically-common logic part. A circuit block L0 and a circuit block L1 illustrated in FIG. 5 have the same arrangement of circuit symbols in an electronic circuit diagram. Accordingly, the commonality determination unit 13B according to the present embodiment determines that the circuit blocks L0 and L1 are graphically common circuits.

On the other hand, the arrangement of circuit symbols of the electronic circuit diagram of the circuit block L0 is different from that of a circuit block L2. Accordingly, the commonality determination unit 13B according to the present embodiment determines that the circuit block L2 is not graphically common to the circuit block L0.

FIG. 6 is an explanatory diagram of a logically-common logic part. A circuit block P and a circuit block Q illustrated in FIG. 6 have graphically different arrangements of circuit symbols, while performing a logically same operation. Accordingly, the logic-commonality determination unit 26B according to the present embodiment determines that the circuit block P and the circuit block Q are logically common logic parts.

The commonality determination unit 13B extracts a common logic part H (a common circuit block) by using both the graphic-commonality determination unit 25B and the logic-commonality determination unit 26B. The commonality determination unit 13B stores the common logic part H extracted by the graphic-commonality determination unit 25B and the logic-commonality determination unit 26B in the search-result storage unit 14.

It is also possible that the commonality determination unit 13B extracts the common logic part H according to an instruction of a user by using one of the graphic-commonality determination unit 25B and the logic-commonality determination unit 26B. In this case, the user inputs an instruction to specify as to which of the graphic-commonality determination unit 25B and the logic-commonality determination unit 26B should be used to the instruction input unit 16. The commonality determination unit 13B then uses one of the graphic-commonality determination unit 25B and the logic-commonality determination unit 26B based on the designation of the user.

When the graphic-commonality determination unit 25B searches for the common logic part H, the common logic part H can be searched easily. When the logic-commonality determination unit 26B searches for the common logic part H, many common logic parts H can be searched. In this case, many common circuit patterns G can be replaced with a program component, and thus a sequence program can be efficiently edited.

As described above, according to the second embodiment, the graphic-commonality determination unit 25B searches for the common logic part H, and thus it is possible to easily search for the common logic part H. Further, because the logic-commonality determination unit 26B searches for the common logic part H, it is possible to search for many common logic parts H.

Third Embodiment

A third embodiment of the present embodiment is described next. In the third embodiment, the size of a common circuit pattern G to be extracted (the number of circuit blocks) is specified by a user. A program componentization process according to the present embodiment can be performed by the program-component creation device 1A, or by the program-component creation device 1B. The program componentization process performed by the program-component creation device 1B is identical to that performed by the program-component creation device 1A, and thus a case where the program-component creation device 1A performs the program componentization process according to the present embodiment is described below.

A user inputs an instruction to specify the size of a common circuit pattern G to be extracted (a block-number specifying instruction) to the instruction input unit 16. The block-number specifying instruction specifies a unit of search for a common logic part H (a circuit block unit). A circuit block is a minimum logic unit for establishing an electric circuit.

The program-component creation device 1A sets the number of circuit blocks specified by the block-number specifying instruction as a search unit and extracts a common circuit pattern G. For example, when "the number Nx of circuit blocks=3" is input as the block-number specifying instruction, the program-component creation device 1A extracts a set of circuit blocks in which three successive circuit blocks are common to other three successive circuit blocks and extracts the common circuit pattern G from the set of circuit blocks.

A process procedure of a program componentization process according to the third embodiment is described next. Descriptions of the same processes as those in the program componentization process according to the first embodiment will be omitted.

A user inputs the block-number specifying instruction to specify the size of a common circuit pattern G to be extracted and the search instruction to the instruction input unit 16. The block-number specifying instruction and the search instruction are transmitted from the instruction input unit 16 to the commonality determination unit 13A.

The commonality determination unit 13A sets the number of circuit blocks specified by the block-number specifying instruction as a search unit and extracts a common circuit pattern G. Specifically, the commonality determination unit 13A extracts common circuit patterns G having the same number of circuit blocks specified by the block-number specifying instruction from a sequence program. The commonality determination unit 13A thus searches Nx (Nx is a natural number) successive circuit blocks for a common logic part H.

Thereafter, by performing process procedures that are identical to those of the first or second embodiment, the common circuit pattern G is converted into a program component, and the common logic part H present in the sequence program is replaced with the program component.

In the present embodiment, the size of a common circuit pattern G to be extracted is specified by a user. Alternatively, it is also possible that the commonality determination unit 13A extracts a common circuit pattern G whose size is initially set by the commonality determination unit 13A.

As described above, according to the third embodiment, common circuit patterns G that are candidates for componentization can be narrowed down, and thus a componentization operation can be efficiently performed. For example, when "the number Nx of circuit blocks=3" is input as the block-number specifying instruction, common circuit patterns G in a case of "the number Nx of circuit blocks=1 or 2" are not extracted, and thus the number of common circuit patterns G that are candidates for componentization can be reduced.

Fourth Embodiment

Figure 7:
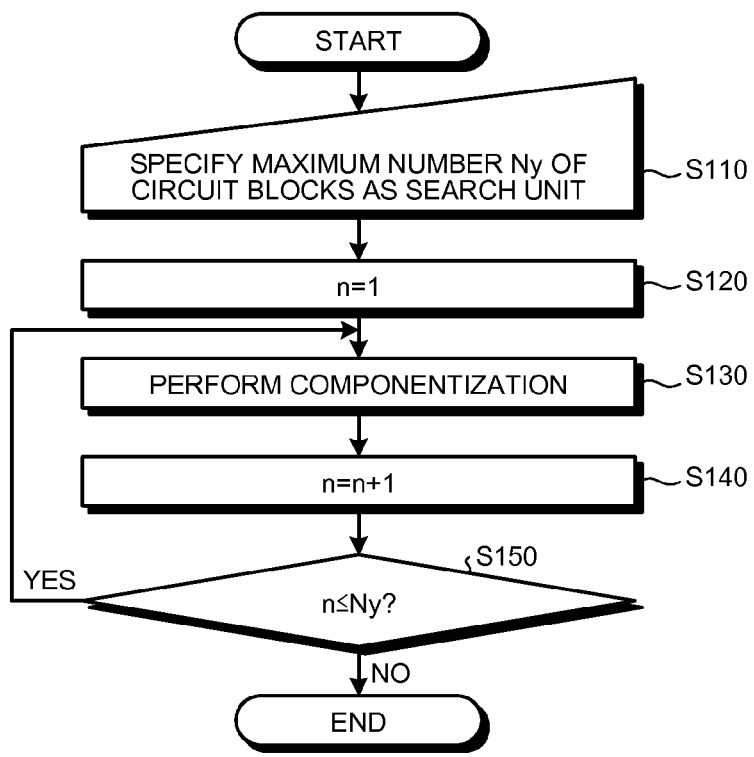
FIG. 7 is a flowchart illustrating a process procedure of a program componentization process according to a fourth embodiment of the present invention.

A fourth embodiment of the present invention is described next with reference to FIGS. 7 and 8. In the fourth embodiment, the upper limit value of the search unit (the number of circuit blocks) for a common circuit pattern G is specified by a user and the common circuit pattern G is extracted while increasing the number of circuit blocks as the search unit.

A program componentization process according to the present embodiment can be performed by the program-component creation device 1A, or by the program-component creation device 1B. The program componentization process performed by the program-component creation device 1A is identical to that performed by the program-component creation device 1B, and thus a case where the program-component creation device 1A performs the program componentization process according to the present embodiment is described below.

The program-component creation device 1A sets a number of circuit blocks that is equal to or smaller than the number of circuit blocks specified by the block-number specifying instruction as a search unit and extracts a common circuit pattern G. For example, when "the maximum number Ny of circuit blocks=3" is input as the block-number specifying instruction, the program-component creation device 1A extracts the common circuit pattern G from circuit blocks whose number is 1 to 3.

A process procedure of a program componentization process according to the fourth embodiment is described next. FIG. 7 is a flowchart illustrating a process procedure of the program componentization process according to the fourth embodiment. Descriptions of like processes as those in the program componentization process according to the first embodiment will be omitted.

A user inputs the block-number specifying instruction to specify the size of a common circuit pattern G to be extracted and the search instruction to the instruction input unit 16. The block-number specifying instruction according to the present embodiment specifies the maximum number Ny (Ny is a natural number) of circuit blocks as a search unit. In other words, the upper limit value of the search unit is input to the instruction input unit 16 (Step S110).

The block-number specifying instruction (the maximum number Ny of circuit blocks) and the search instruction are transmitted from the instruction input unit 16 to the commonality determination unit 13A. The commonality determination unit 13A sets a circuit pattern where the number of circuit blocks is equal to or smaller than the maximum number Ny of circuit blocks specified by the block-number specifying instruction as the search unit and extracts the common circuit pattern G.

Specifically, the commonality determination unit 13A sets a search unit n for the common circuit pattern G as n=1 (Step S120). The commonality determination unit 13A extracts a set of circuit blocks in which one circuit block is common to another circuit block and extracts the common circuit pattern G from the extracted set of circuit blocks.

By performing process procedures that are identical to those of the first or second embodiment, the sequence program is componentized (Step S130). The process at Step S130 corresponds to Steps S20 to S80 of FIG. 3. That is, a common circuit pattern G that is constituted by one extracted circuit block is converted into a program component, and a common logic part H of the sequence program is replaced with the program component.

The commonality determination unit 13A then sets the search unit n for the common circuit pattern G as n=n+1 (Step S140). The commonality determination unit 13A determines whether n≤Ny is satisfied (Step S150).

When n≤Ny is satisfied (YES at Step S150), the commonality determination unit 13A repeats the process of extracting the common circuit pattern G. Specifically, the commonality determination unit 13A repeats the processes at Steps S130 to S150. The commonality determination unit 13A extracts a set of circuit blocks in which two successive circuit blocks are common to other two successive circuit blocks, and then extracts the common circuit pattern G from the extracted set of circuit blocks. By performing process procedures that are identical to those of the first or second embodiment, the process of componentizing a sequence program is performed (Step S130).

The commonality determination unit 13A then sets the search unit n for the common circuit pattern G as n=n+1 (Step S140). The commonality determination unit 13A determines whether n≤Ny is satisfied (Step S150). In this manner, the commonality determination unit 13A repeats the process of extracting the common circuit pattern G while changing the search unit for the common circuit pattern G sequentially from n=1 to n=Ny. When it is n>Ny (NO at Step S150), the commonality determination unit 13A ends the process of extracting the common circuit pattern G.

Figure 8:
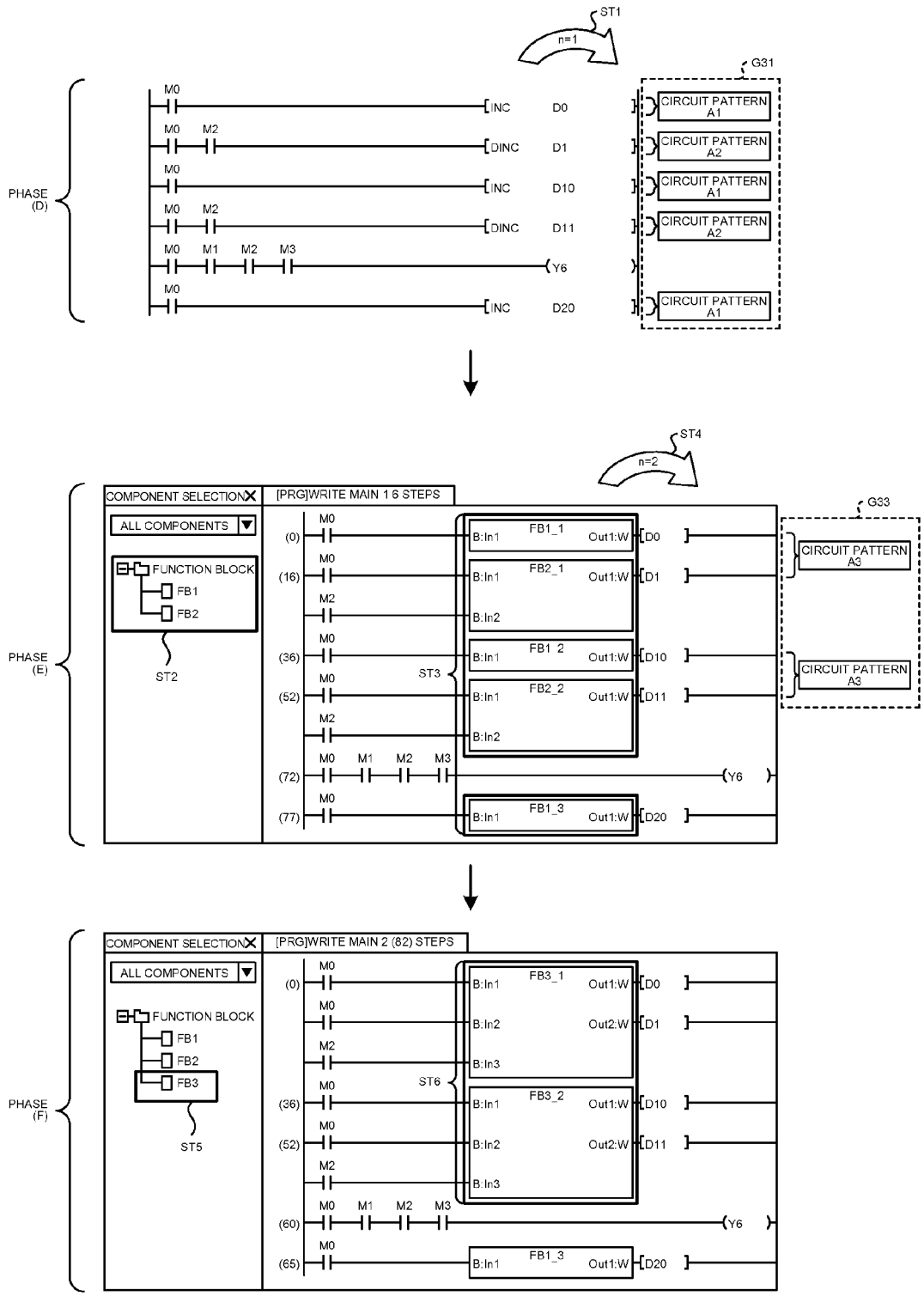
FIG. 8 is an explanatory diagram of a process of extracting a common circuit pattern while increasing the number of circuit blocks as a search unit.

FIG. 8 is an explanatory diagram of a process of extracting a common circuit pattern while increasing the number of circuit blocks as a search unit. FIG. 8 illustrates a process procedure in a case where "the maximum number Ny of circuit blocks=2" is specified.

As illustrated in a phase (D) of FIG. 8, when a user specifies "the maximum number Ny of circuit blocks=2" as the search unit, the commonality determination unit 13A sets the search unit n for a common circuit pattern G as n=1 (ST1). The commonality determination unit 13A extracts a set of circuit blocks in which one circuit block is common to another circuit block and extracts the common circuit pattern G from the extracted set of circuit blocks. FIG. 8 illustrates a case where three circuit patterns A1 and two circuit patterns A2 are extracted as a common circuit pattern G31.

As illustrated in a phase (E) of FIG. 8, the program-component registration unit 17 converts the extracted circuit pattern A1 into a program component FB1 and stores the program component FB1 in the program-component storage unit 18. The program-component registration unit 17 also converts the extracted circuit pattern A2 into a program component FB2 and stores the program component FB2 in the program-component storage unit 18 (ST2).

The componentization processing unit 19 replaces a part corresponding to the common logic part H (the circuit pattern A1) of the sequence program in the program storage unit 12 with the program component FB1 that has been registered in the program-component storage unit 18.

Similarly, the componentization processing unit 19 replaces a part corresponding to the common logic part H (the circuit pattern A2) of the sequence program in the program storage unit 12 with the program component FB2 that has been registered in the program-component storage unit 18 (ST3).

The commonality determination unit 13A then sets the search unit n for the common circuit pattern G as n=2 (ST4). The commonality determination unit 13A extracts a set of circuit blocks in which two circuit blocks are common to other two circuit blocks and extracts the common circuit pattern G from the extracted set of circuit blocks. A phase (E) of FIG. 8 illustrates a case where two circuit patterns A3 are extracted as a common circuit pattern G33. The circuit pattern A3 is two successive circuit blocks.

As illustrated in a phase (F) of FIG. 8, the program-component registration unit 17 converts the extracted circuit pattern A3 into a program component FB3 and registers the program component FB3 in the program-component storage unit 18 (ST5). The componentization processing unit 19 replaces a part corresponding to the common logic part H (the circuit pattern A3) of the sequence program in the program storage unit 12 with the program component FB3 that has been registered in the program-component storage unit 18 (ST6).

As described above, according to the fourth embodiment, because the common circuit pattern G is extracted while increasing the number of circuit blocks as a search unit and the program componentization process is repeated, it is possible to create a program component over a wide range.

Fifth Embodiment

Figure 9:
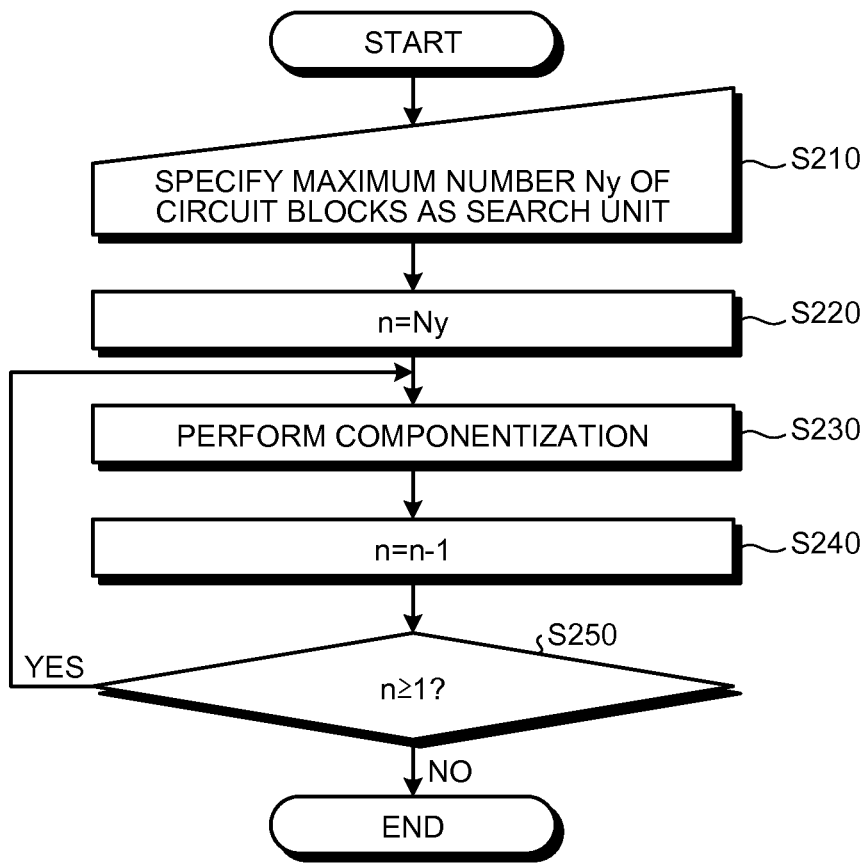
FIG. 9 is a flowchart illustrating a process procedure of a program componentization process according to a fifth embodiment of the present invention.

A fifth embodiment of the present invention is described next with reference to FIGS. 9 to 11. In the fifth embodiment, the upper limit value of the search unit for a common circuit pattern G (the number of circuit blocks) is specified by a user, and the common circuit pattern G is extracted while reducing the number of circuit blocks as the search unit.

A program componentization process according to the present embodiment can be performed by the program-component creation device 1A, or by the program-component creation device 1B. The program componentization process performed by the program-component creation device 1B is identical to that performed by the program-component creation device 1A, and thus a case where the program-component creation device 1A performs the program componentization process according to the present embodiment is described below.

The program-component creation device 1A sets the number of circuit blocks that is equal to or smaller than the number of circuit blocks specified by the block-number specifying instruction as the search unit and extracts a common circuit pattern G. For example, when "the maximum number Ny of circuit blocks=3" is input as the block-number specifying instruction, the program-component creation device 1A extracts the common circuit pattern G from circuit blocks whose number is 1 to 3.

A process procedure of a program componentization process according to the fifth embodiment is described next. FIG. 9 is a flowchart illustrating a process procedure of the program componentization process according to the fifth embodiment. Descriptions of the same processes as those in the program componentization process according to the first embodiment will be omitted.

A user inputs the block-number specifying instruction to specify the size of a common circuit pattern G to be extracted and the search instruction to the instruction input unit 16. The block-number specifying instruction according to the present embodiment specifies the maximum number Ny of circuit blocks as the search unit. In other words, the upper limit value of the search unit is input to the instruction input unit 16 (Step S210).

The block-number specifying instruction (the maximum number Ny of circuit blocks) and the search instruction are transmitted from the instruction input unit 16 to the commonality determination unit 13A. The commonality determination unit 13A sets a circuit pattern where the number of circuit blocks is equal to or smaller than the maximum number Ny of circuit blocks specified by the block-number specifying instruction as a search unit and extracts the common circuit pattern G.

Specifically, the commonality determination unit 13A sets the search unit n for the common circuit pattern G as n=Ny (Step S220). When Ny successive circuit blocks are common to other Ny successive circuit blocks, the commonality determination unit 13A extracts the common circuit pattern G from these circuit blocks.

Thereafter, by performing process procedures that are identical to those of the first or second embodiment, a process of componentizing the sequence program is performed (Step S230). That is, a common circuit pattern G that is constituted by the extracted Ny circuit blocks is converted into a program component and a common logic part H of the sequence program is replaced with the program component.

The commonality determination unit 13A then sets the search unit n for the common circuit pattern G as n=n−1 (Step S240). The commonality determination unit 13A determines whether n≥1 is satisfied (Step S250).

When n≥1 is satisfied (YES at Step S250), the commonality determination unit 13A repeats the process of extracting the common circuit pattern G. Specifically, the commonality determination unit 13A repeats the processes at Steps S230 to S250. When (Ny−1) successive circuit blocks are common to other (Ny−1) successive circuit blocks, the commonality determination unit 13A extracts the common circuit pattern G from these circuit blocks. By performing process procedures that are identical to those of the first or second embodiment, the process of componentizing a sequence program is then performed (Step S230).

Thereafter, the commonality determination unit 13A sets the search unit n for the common circuit pattern G as n=n−1 (Step S240). The commonality determination unit 13A determines whether n≥1 is satisfied (Step S250). In this manner, the commonality determination unit 13A repeats the process of extracting the common circuit pattern G while changing the search unit for the common circuit pattern G sequentially from n=Ny to n=1. When n≥1 is satisfied (NO at Step S250), the commonality determination unit 13A ends the process of extracting the common circuit pattern G.

Figure 10:
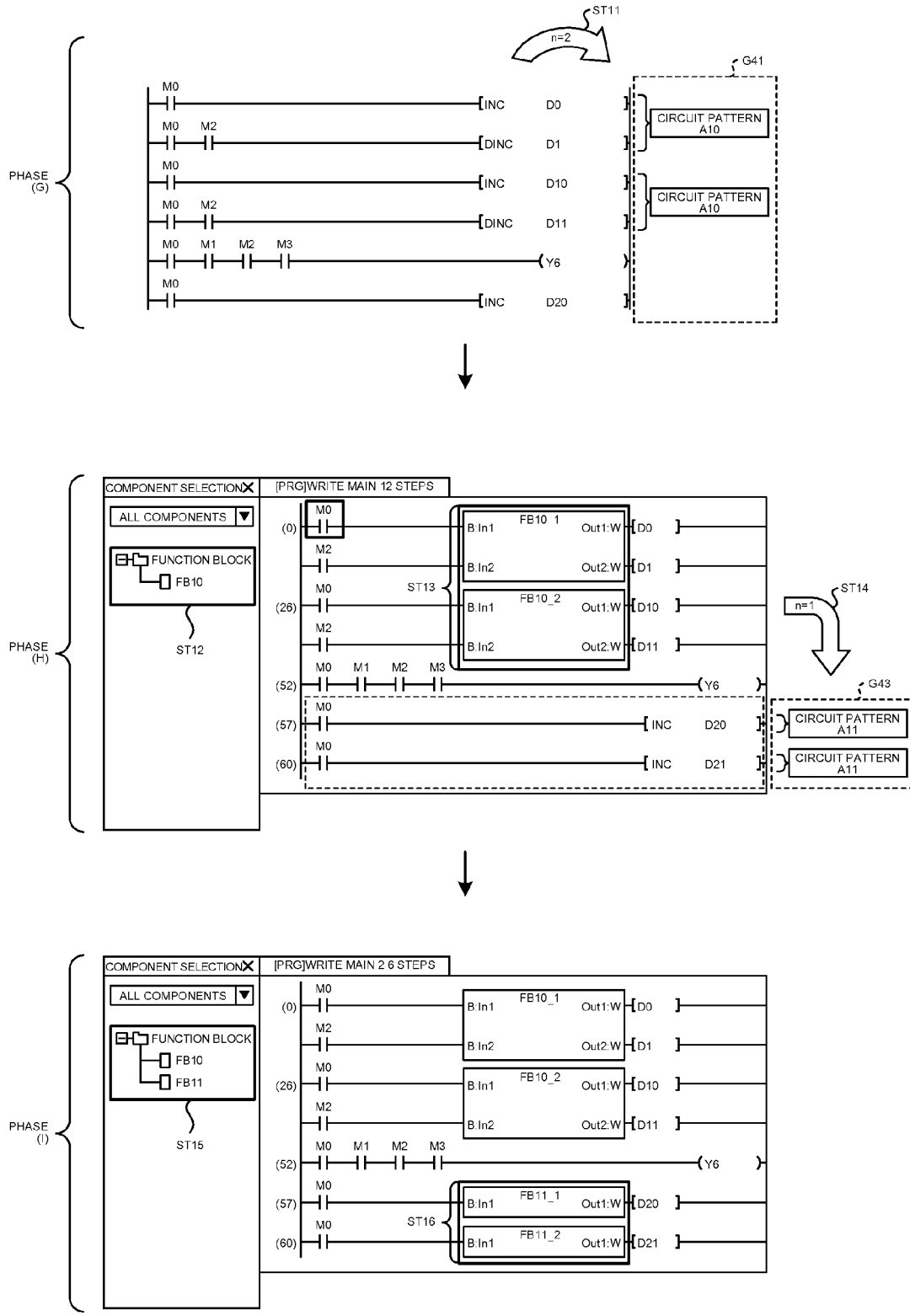
FIG. 10 is an explanatory diagram of a process of extracting a common circuit pattern while reducing the number of circuit blocks as a search unit.

FIG. 10 is an explanatory diagram of a process of extracting a common circuit pattern while reducing the number of circuit blocks as a search unit. FIG. 10 illustrates a process procedure in a case where "the maximum number Ny of circuit blocks=2" is specified.

As illustrated in a phase (G) of FIG. 10, when a user specifies "the maximum number Ny of circuit blocks=2" as a search unit, the commonality determination unit 13A sets the search unit n for a common circuit pattern G as n=2 (ST11). The commonality determination unit 13A extracts a set of circuit blocks in which two circuit blocks are common to other two circuit blocks and extracts the common circuit pattern G from the extracted set of circuit blocks. A phase (G) of FIG. 10 illustrates a case where two circuit patterns A10 are extracted as a common circuit pattern G41. The circuit patterns A10 are respectively two successive circuit blocks.

As illustrated in a phase (H) of FIG. 10, the program-component registration unit 17 converts the extracted circuit pattern A10 into a program component FB10 and stores the program component FB10 in the program-component storage unit 18 (ST12). The componentization processing unit 19 then replaces a part corresponding to a common logic part H (the circuit pattern A10) of a sequence program in the program storage unit 12 with the program component FB10 that has been registered in the program-component storage unit 18 (ST13).

Thereafter, the commonality determination unit 13A sets the search unit n for the common circuit pattern G as n=1 (ST14). The commonality determination unit 13A then extracts a set of circuit blocks in which one circuit block is common to another circuit block and extracts the common circuit pattern G from the extracted set of circuit blocks. FIG. 10 illustrates a case where two circuit patterns A11 are extracted as a common circuit pattern G43.

As illustrated in a phase (I) of FIG. 10, the program-component registration unit 17 converts the extracted circuit pattern A11 into a program component FB11 and registers the program component FB11 in the program-component storage unit 18 (ST15). The componentization processing unit 19 replaces a part corresponding to the common logic part H (the circuit pattern A11) of a sequence program in the program storage unit 12 with the program component FB11 that has been registered in the program-component storage unit 18 (ST16).

FIG. 11 is a diagram illustrating an example of a common circuit pattern to be extracted. FIG. 11 illustrates an example of a common circuit pattern that is extracted when "the maximum number Ny of circuit blocks=3" is specified. A user inputs a block-number specifying instruction to specify the size of a common circuit pattern G to be extracted (the maximum number Ny of circuit blocks=3) and a search instruction to the instruction input unit 16.

For example, as illustrated in a phase (J) of FIG. 11, when a circuit pattern 51 constituted by three successive circuit blocks is common to a circuit pattern 52 constituted by three successive circuit blocks, the commonality determination unit 13A extracts the circuit patterns 51 and 52.

Furthermore, as illustrated in a phase (K) of FIG. 11, the commonality determination unit 13A extracts a logic pattern that appears in common in the circuit patterns 51 and 52 as the common circuit pattern G. FIG. 11 illustrates a case where a common circuit pattern G50 is extracted as the common circuit pattern G corresponding to the circuit patterns 51 and 52. The search-result display processing unit 15 displays the common circuit pattern G50 on the display device 5.

The program-component creation device 1A may set the minimum number Nz of circuit blocks as well as the maximum number Ny of circuit blocks. In other words, a user may specify a lower limit value of the search unit for the common circuit pattern G (the number of circuit blocks). The minimum number Nz of circuit blocks is a threshold of search and the minimum value of a circuit block to be searched for. In this case, the number of circuit blocks that is equal to or larger than the lower limit value specified by a user and is equal to or smaller than an upper limit value specified by a user is set as the search unit for the common circuit pattern G.

Specifically, the commonality determination unit 13A extracts a common circuit pattern G that is constituted by Nz to Ny circuit blocks. In this case, the commonality determination unit 13A may repeat componentization while increasing the number of circuit blocks, or while reducing the number of circuit blocks.

For example, when "the minimum number Nz of circuit blocks=3" and "the maximum number Ny of circuit blocks=6" are specified, the commonality determination unit 13A extracts a common circuit pattern G constituted by three to six circuit blocks.

It is also possible that the program-component creation device 1A extracts the common circuit pattern G by any of the methods described in the first to fifth embodiments, extracts only a common circuit pattern G where the number of circuit blocks is larger than the minimum number Nz of circuit blocks from the extracted common circuit patterns G, and displays a list of the common circuit pattern G.

It is also possible that the program-component creation device 1A extracts the common circuit pattern G by any of the methods described in the first to fifth embodiments, extracts only a common circuit pattern G where the number of circuit blocks is smaller than the maximum number Ny of circuit blocks from the extracted common circuit patterns G, and displays a list of the common circuit pattern G.

The program-component creation device 1A may set only the minimum number Nz of circuit blocks. For example, when "the minimum number Nz of circuit blocks=3" is input as a block-number specifying instruction, the program-component creation device 1A extracts a set of circuit blocks where the number of circuit blocks is equal to or larger than four as the common circuit pattern G. The minimum number Nz of circuit blocks is a threshold of search and the minimum value of a circuit block to be searched for.

In this case, the commonality determination unit 13A may repeat componentization while increasing the number of circuit blocks, or while reducing the number of circuit blocks. For example, when the number of circuit blocks of a sequence program is Na (Na is a natural number), the commonality determination unit 13A repeats componentization while reducing the number of circuit blocks sequentially from Na to Nz. Alternatively, when the number of circuit blocks of a sequence program is Na, the commonality determination unit 13A may repeat componentization while increasing the number of circuit blocks sequentially from Nz to Na.

As described above, according to the fifth embodiment, because the common circuit pattern G is extracted and a program componentization process is repeated while reducing the number of circuit blocks as a search unit, it is possible to reduce the number of program components to be created.

Sixth Embodiment

A sixth embodiment of the present invention is described next. In the sixth embodiment, among common circuit patterns G, a common circuit pattern G where the number of common logic parts H is larger than a number (a threshold) specified by a user is displayed as a candidate for a program component. In other words, only a common circuit pattern G from which common logic parts H whose number is larger than a predetermined number have been extracted is displayed.

A program componentization process according to the present embodiment can be performed by the program-component creation device 1A, or by the program-component creation device 1B. The program componentization process performed by the program-component creation device 1B is identical to that performed by the program-component creation device 1A, and thus a case where the program-component creation device 1A performs the program componentization process according to the present embodiment is described below.

The number of the common logic parts H (hereinafter, "common number") is different for each common circuit pattern G. A user inputs a lower limit value of a common number (a display threshold) to the instruction input unit 16 according to the present embodiment. The lower limit value of the common number is the number of the common logic parts H (a lower limit value) that should be included in the common circuit pattern G that is displayed as a candidate for a program component.

The common number is transmitted from the instruction input unit 16 to the commonality determination unit 13A. The commonality determination unit 13A extracts a common circuit pattern G that has more common logic parts H than the common number from the common circuits patterns G in the search-result storage unit 14.

Next, hardware configurations of the program-component creation devices 1A and 1B are described. The hardware configuration of the program-component creation device 1A is identical to that of the program-component creation device 1B, and thus the hardware configuration of the program-component creation device 1A is described below.

Figure 12:
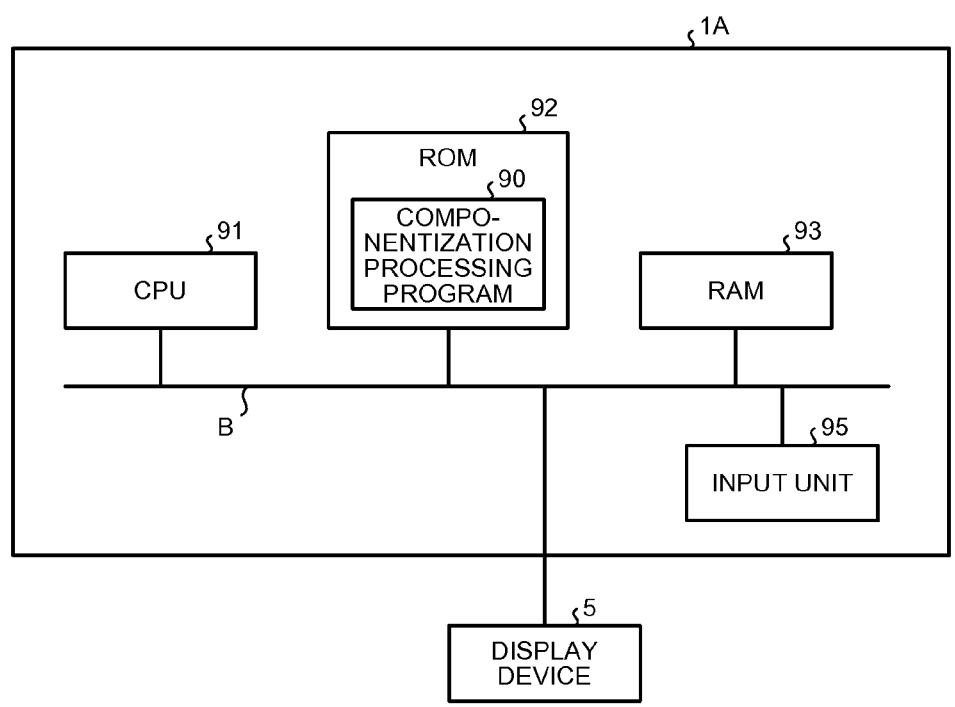
FIG. 12 is a diagram illustrating a hardware configuration of a program-component creation device.

FIG. 12 is a diagram illustrating a hardware configuration of a program-component creation device. The program-component creation device 1A includes a CPU (Central Processing Unit) 91, a ROM (Read Only Memory) 92, a RAM (Random Access Memory) 93, and an input unit 95. In the program-component creation device 1A, the CPU 91, the ROM 92, the RAM 93, and the input unit 95 are connected via a bus line B to one another.

The CPU 91 determines a pattern by using a componentization processing program (sequence-program-component creation program) 90 that is a computer program. The input unit 95 is constituted by including a mouse and a keyboard and inputs instruction information (a parameter required for a program componentization process and the like) that is externally input by a user. The instruction information that is input to the input unit 95 is transmitted to the CPU 91.

The componentization processing program 90 is stored in the ROM 92 and loaded via the bus line B into the RAM 93. The CPU 91 executes the componentization processing program 90 loaded into the RAM 93. Specifically, in the program-component creation device 1A, in response to an instruction that is input from the input unit 95 by a user, the CPU 91 reads the componentization processing program 90 from the ROM 92, expands the program 90 in a program storage area in the RAM 93, and performs various processes. The CPU 91 temporarily stores various data generated in the various processes in a data storage area formed within the RAM 93.

The componentization processing program 90 executed by the program-component creation device 1A has a module configuration in which the commonality determination unit 13A, the search-result storage unit 14, the search-result display processing unit 15, the program-component registration unit 17, the program-component storage unit 18, and the componentization processing unit 19 are included. These units are loaded onto a main storage unit and are generated thereon.

As described above, according to the sixth embodiment, circuit patterns are narrowed down to a versatile circuit pattern, and then a candidate for a program component (a common circuit pattern G) is displayed, and thus a user can easily select a candidate for componentization.

INDUSTRIAL APPLICABILITY

As described above, the sequence-program-component creation program and a sequence-program-component creation device according to the present invention are suitable for creation of a program component.

REFERENCE SIGNS LIST

1A, 1B program-component creation device, 2a to 4a circuit block, 11 program input unit, 12 program storage unit, 13A, 13B commonality determination unit, 14 search-result storage unit, 15 search-result display processing unit, 16 instruction input unit, 17 program-component registration unit, 18 program-component storage unit, 19 componentization processing unit, 20 output unit, 25B graphic-commonality determination unit, 26B logical-commonality determination unit, 90 componentization processing program, 100A, 100B program editing system, L0 to L2, P, Q circuit block.

The invention claimed is:

1. A non-transitory computer readable recording medium having stored thereon a sequence-program-component creation program that, when executed, causes a computer to perform:
   a searching step of searching an overall circuit of a sequence program for a common logic part and extracting a logic pattern that appears in common in a circuit pattern arranged in the common logic part as a common circuit pattern;
   a component-candidate displaying step of displaying the extracted common circuit pattern as a candidate among candidates for a program component;
   a component registration setting step of registering the extracted common circuit pattern, selected by a user from the candidates for the program component, as the program component; and
   a replacing step of replacing the common logic part of the sequence program with the program component, wherein
   the searching comprises:
      inputting, by a user, a natural number which is a number of first circuit blocks to be used as a search unit during the searching;
      searching the common logic part using the number of first circuit blocks specified by the user as the search unit; and
      identifying a logic pattern that is common to a group of first circuit blocks numbering equal to or greater than the natural number as a matching logic pattern, and extracting the matching logic pattern as the common circuit pattern.

2. The sequence-program-component creation program according to claim 1, wherein the searching step comprises searching a logic part having a same circuit diagram as the common logic part.

3. The sequence-program-component creation program according to claim 1, wherein the searching step comprises searching a logic part having a same logic of a circuit diagram as the common logic part.

4. The sequence-program-component creation program according to claim 1, wherein the sequence-program-component creation program further causes the computer to perform:
   a search process that uses a number of second circuit blocks as a search unit, and
   a process of setting a common circuit pattern of the number of second circuit blocks as a program component, the process of setting the common circuit pattern being repeated while increasing the number of second circuit blocks one by one sequentially, until the number of second circuit blocks becomes equal to the number of first circuit blocks.

5. The sequence-program-component creation program according to claim 1, wherein the sequence-program-component creation program further causes the computer to perform:
   a search process that uses a number of first circuit blocks as a search unit, and
   a process of setting a common circuit pattern of the number of first circuit blocks as a program component, the process of setting the common circuit pattern being repeated while reducing the number of first circuit blocks one by one sequentially, until the number of first circuit blocks becomes a predetermined number of circuit blocks.

6. The sequence-program-component creation program according to claim 1, wherein the component-candidate displaying step comprises displaying a common circuit pattern in which a number of the common logic parts included in the common circuit pattern is larger than a number specified by a user as a candidate for a program component.

7. A sequence-program-component creation device having a hardware processor comprising:
   a searching section that searches an overall circuit of a sequence program for a common logic part and extracts a logic pattern that appears in common in a circuit pattern arranged in the common logic part as a common circuit pattern;
   a component-candidate display unit that displays the extracted common circuit pattern as a candidate among candidates for a program component;
   a component registration unit that registers the extracted common circuit pattern selected by a user from the candidates for the program component, as the program component; and
   a replacement unit that replaces the common logic part of the sequence program with the program component, wherein
   the searching section receives, as input from a user, a natural number which is a number of first circuit blocks to be used as a search unit during the search, searches for the common logic part using the number of first circuit blocks specified by the user as the search unit, identifies a logic pattern that is common to a group of first circuit blocks numbering equal to or greater than the natural number as a matching logic pattern, and extracting the matching logic pattern as the common circuit pattern.

* * * * *